US008674833B2

(12) United States Patent
Johnston et al.

(10) Patent No.: US 8,674,833 B2
(45) Date of Patent: Mar. 18, 2014

(54) UNIVERSAL CAMERA SENSOR HAVING MOVABLE MOUNT FOR RETAINING POWER CONNECTOR

(75) Inventors: Michael R. Johnston, Waxhaw, NC (US); Larry K. Hooks, Jr., Fort Mill, SC (US)

(73) Assignee: InVue Security Products Inc., Charlotte, NC (US)

( * ) Notice: Subject to any disclaimer, the term of this patent is extended or adjusted under 35 U.S.C. 154(b) by 344 days.

(21) Appl. No.: 13/173,904

(22) Filed: Jun. 30, 2011

(65) Prior Publication Data

US 2012/0192600 A1 Aug. 2, 2012

Related U.S. Application Data

(60) Provisional application No. 61/438,084, filed on Jan. 31, 2011.

(51) Int. Cl.

| | |
|---|---|
| ***G08B 13/14*** | (2006.01) |
| ***G08B 13/12*** | (2006.01) |
| ***G08B 13/26*** | (2006.01) |
| ***H03M 1/12*** | (2006.01) |
| ***H04M 1/00*** | (2006.01) |
| ***G06F 7/00*** | (2006.01) |
| ***G06F 1/00*** | (2006.01) |

(52) U.S. Cl.
USPC .................. 340/568.1; 340/568.3; 340/568.8; 340/562; 341/172; 455/572; 700/214; 713/300

(58) Field of Classification Search
USPC ......... 340/568.1, 568.3, 568.8, 562; 341/172; 455/572; 700/214; 713/300
See application file for complete search history.

(56) References Cited

U.S. PATENT DOCUMENTS

| | | | | |
|---|---|---|---|---|
| 5,128,770 A * | 7/1992 | Inana et al. | ................ | 348/211.4 |
| 5,146,205 A | 9/1992 | Keifer et al. | | |
| D335,439 S | 5/1993 | Leyden et al. | | |
| 5,421,667 A | 6/1995 | Leyden et al. | | |
| 5,861,807 A | 1/1999 | Leyden et al. | | |

(Continued)

OTHER PUBLICATIONS

Definition of Rotatable, Collins English Dictionary, Accessed Oct. 23, 2013.*

(Continued)

*Primary Examiner* — Daniel Wu
*Assistant Examiner* — Emily C Terrell
(74) *Attorney, Agent, or Firm* — InVue Security Products Inc.

(57) ABSTRACT

A sensor is provided for displaying an item of merchandise on a display stand. The sensor includes a bottom portion having a recess formed therein and a top portion movably disposed on the bottom portion and adapted for attaching the item of merchandise to the sensor. A power connector is configured to be received within the recess formed in the bottom portion and retained therein when the top portion is aligned with and secured to the bottom portion such that the power connector cannot be removed from the sensor. The sensor may further include an optional anti-rotation bracket for preventing an unauthorized person from rotating the merchandise relative to the sensor and thereby detaching the item of merchandise from the sensor. The display stand may include a base and a cam sleeve rotatably disposed within the base so that the item of merchandise may be positioned in different desired display orientations on the display stand without removing and reorienting the base on a support surface or without reorienting the merchandise on the sensor.

18 Claims, 11 Drawing Sheets

(56) References Cited

U.S. PATENT DOCUMENTS

| | | | | |
|---|---|---|---|---|
| 6,027,277 | A | 2/2000 | Leyden et al. | |
| 6,380,855 | B1 * | 4/2002 | Ott | 340/568.2 |
| 6,761,579 | B2 * | 7/2004 | Fort et al. | 439/501 |
| 6,946,961 | B2 * | 9/2005 | Frederiksen et al. | 340/568.2 |
| 7,135,972 | B2 * | 11/2006 | Bonato | 340/568.2 |
| 7,202,417 | B2 * | 4/2007 | Marszalek et al. | 174/113 R |
| 7,242,299 | B2 * | 7/2007 | Kelsch et al. | 340/568.1 |
| 7,327,276 | B1 * | 2/2008 | Deconinck et al. | 340/687 |
| 7,614,601 | B2 | 11/2009 | Marsilio et al. | |
| 7,626,500 | B2 | 12/2009 | Belden, Jr. et al. | |
| 7,710,266 | B2 | 5/2010 | Belden, Jr. et al. | |
| 7,740,214 | B2 | 6/2010 | Marsilio et al. | |
| 8,537,013 | B2 * | 9/2013 | Yeager et al. | 340/568.8 |
| 2004/0229498 | A1 | 11/2004 | Fort et al. | |
| 2005/0073413 | A1 * | 4/2005 | Sedon et al. | 340/568.8 |
| 2007/0194918 | A1 | 8/2007 | Rabinowitz et al. | |
| 2009/0033492 | A1 * | 2/2009 | Rapp et al. | 340/568.8 |
| 2011/0084838 | A1 * | 4/2011 | Fawcett | 340/568.8 |

OTHER PUBLICATIONS

Definition of Movable, Collins English Dictionary, Accessed Oct. 23, 2013.*

* cited by examiner

UNIVERSAL CAMERA SENSOR HAVING MOVABLE MOUNT FOR RETAINING POWER CONNECTOR

CROSS REFERENCE TO RELATED APPLICATION

This non-provisional utility patent application claims the benefit of priority of U.S. Provisional Patent Application No. 61/438,084 filed on Jan. 31, 2011, the entire disclosure of which is incorporated herein by reference.

BACKGROUND OF THE INVENTION

The present invention relates generally to merchandise display security devices for protecting items of merchandise from theft. More particularly, the invention relates to a universal camera sensor having a movable mount for attaching an item of merchandise to a merchandise display security device, such as a merchandise display stand, and for retaining a power connector on the sensor. In another aspect, the invention relates to a merchandise display stand having a cam sleeve for receiving the camera sensor that is rotatable to align an item of merchandise in at least two different display orientations.

It is common practice for retailers to display relatively expensive items of merchandise on a merchandise display security device, such as a display stand, alarm module, secure fixture, or the like. The security device typically displays an item of merchandise so that a potential purchaser may readily view and, in some instances, operate the item before deciding to make a purchase. At the same time, the item of merchandise is typically secured on the security device so as to prevent, or at least deter, theft of the item. The merchandise display security device may also include an audible and/or visible alarm that is activated to alert store personnel in the event that a shoplifter attempts to remove the item from the security device.

Oftentimes, the retailer desires to provide the item of merchandise with electrical power to permit the potential purchaser to operate the merchandise and evaluate its features and functions. While most items of consumer electronics merchandise include an internal source of power (e.g. battery), it is not always feasible or practical to utilize the internal power source of the item since a battery requires periodic replacement or recharging. In addition, the battery charge may dissipate while the item is on display and render the merchandise inoperable, possibly discouraging the potential purchaser from purchasing the item.

It is known for a merchandise display security device to include a power adapter cord, referred to herein as a "power connector," for supplying power to an item of merchandise from an external source of power. However, use of a power connector (also commonly referred to as a "pigtail") requires connecting and routing an electrical cord from the merchandise display security device to the item of merchandise. When in use, the power connector must be routed and managed in a manner that does not interfere with the display of the merchandise, or with the operation and evaluation of the merchandise by a potential purchaser. In addition, the power connector must be routed and managed in a manner that does not allow the cord to be easily removed or unplugged by an unauthorized person. In some instances, a shoplifter mistakenly believes that removing or unplugging the power connector disables the sensor and/or the alarm of the merchandise display security device. In other instances, malicious persons attempt to disturb the display by removing or unplugging the power connector.

A further problem is encountered with merchandise display security devices for use with handheld cameras, tripod mount cameras, single-lens reflex (SLR) cameras and videorecorders. These items of merchandise have varying sizes and shapes, and in particular, various thicknesses. As a result, numerous different sensors are required for mounting the item of merchandise onto the merchandise display security device in the desired position and orientation for display. The use of different sensors, however, complicates installation of the item of merchandise on the merchandise display security device and requires the retailer to maintain a sufficient inventory of each of the different sensors. In either case, both the cost and complexity incurred by the retailer to protect the items of merchandise is unnecessarily increased.

Yet another problem is presented by items of merchandise having widely varying sizes and shapes. In particular, retailers often desire to mount certain items of merchandise, for example smaller cameras and camcorders, in one orientation relative to the display stand, and to mount other items of merchandise, for example larger single-lens reflex (SLR) cameras and camcorders, in another orientation. In most instances, the desired mounting orientations are about ninety degrees (90°) apart. As a result, it is oftentimes necessary for store personnel to remove the merchandise display stand from the support surface (e.g. counter, tabletop, shelf, etc.) of the display area and reorient the display stand when an item of merchandise is replaced with another item of merchandise having a different size and/or shape. Removal and reorientation of the merchandise display stand is required to maintain a consistent organization and presentation of the merchandise display security devices, commonly referred to as the "planagram," within the display area of the retail store. However, removal and reinstallation of a merchandise display stand is time consuming and costly, and can be disruptive to potential purchasers if undertaken while the store is open to customers.

Accordingly, there exists an unresolved need for a merchandise display security device including a sensor and a power connector for supplying electrical power to an item of merchandise on display in a retail store that overcomes the disadvantages of the known sensors. There exists a further, and more particular, need for a merchandise display security device including a sensor and a power connector that does not interfere with the display of the merchandise or with the operation and evaluation of the merchandise by a potential purchaser. There exists a specific need for a sensor and a power connector for supplying electrical power to an item of merchandise on display that does not allow the electrical cord to be easily removed or unplugged by an unauthorized person. There exists a further specific need for a merchandise display security device including a sensor that accommodates items of merchandise that have varying sizes, shapes and thicknesses. There exists a still further specific need for a merchandise display stand that can align an item of merchandise relative to the display stand in at least two different display orientations without removing and reorienting the display stand on the support surface of the display area.

BRIEF DESCRIPTION OF THE DRAWINGS

The detailed description of the invention provided herein may be better understood with reference to the accompanying drawing figures, which depict one or more exemplary embodiments of a merchandise display security device including a sensor and a power connector in accordance with the invention.

DETAILED DESCRIPTION OF EXEMPLARY EMBODIMENTS OF THE INVENTION

Figures 1A, 1B:
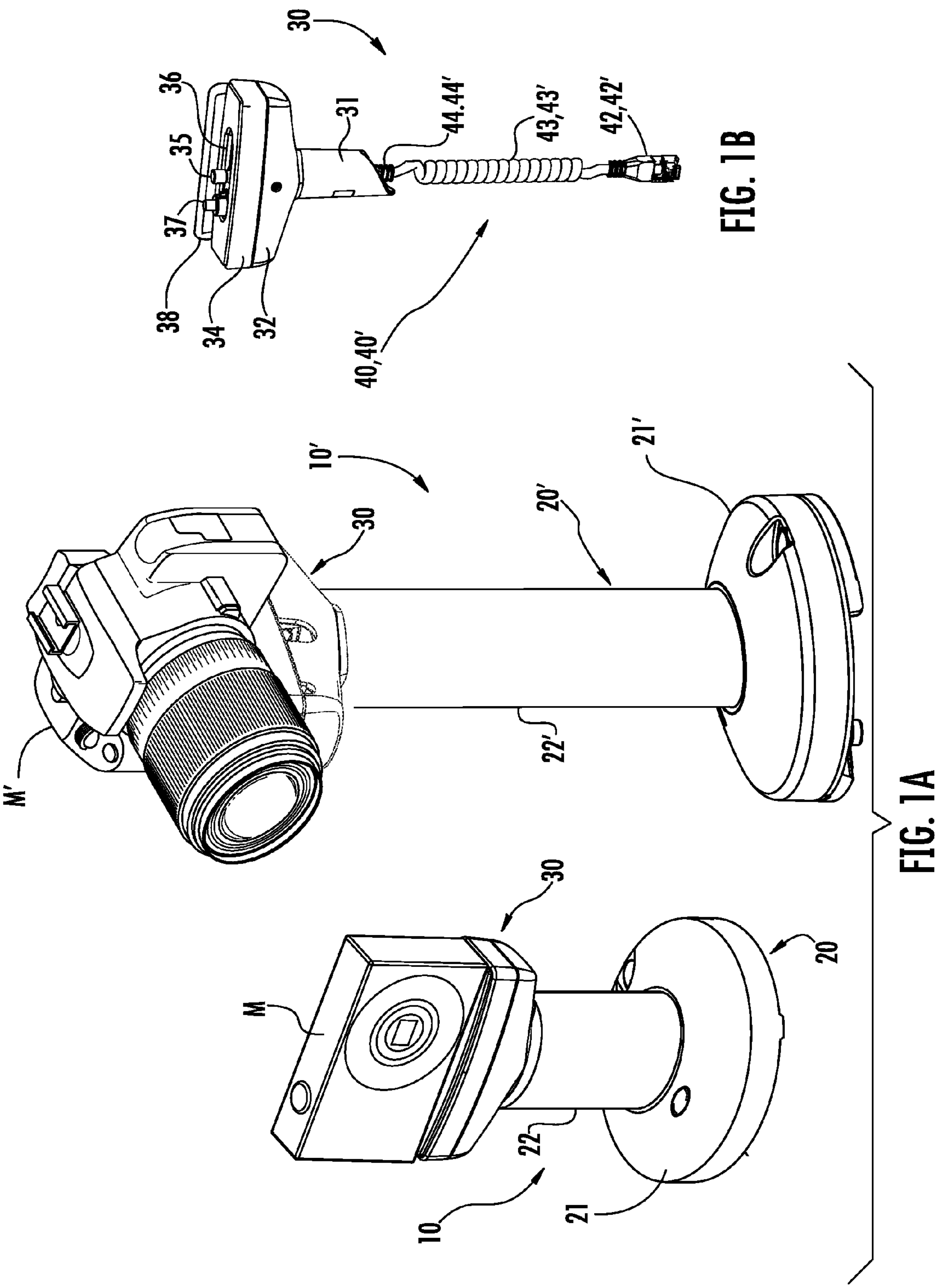
FIG. 1A shows perspective views illustrating exemplary embodiments of merchandise display security devices including a sensor having a movable mount according to the invention.
FIG. 1B shows a perspective view of the sensor of the merchandise display security devices of FIG. 1A.

Referring now to the accompanying drawing figures wherein like reference numerals denote like elements throughout the various views, one or more exemplary embodiments of a merchandise display security device including a sensor and a power connector are shown. Merchandise security devices suitable for use with the invention include, but are not limited to, a display stand, an alarm module, a secure fixture, and the like. As shown and described herein, the merchandise display security device is a display stand of the type available from InVue Security Products Inc. of Charlotte, N.C., USA. However, sensors and power connectors in accordance with the present invention are useable with any merchandise display security device or merchandise display system that requires power to be supplied to an item of merchandise from an external power source, such as a direct current (DC) transformer in electrical communication with a source of alternating current (AC) electricity.

FIG. 1A illustrates a first exemplary embodiment of a display stand, indicated generally at 10, for displaying and protecting relatively small, relatively thin items of merchandise on display in a retail store, such as smaller cameras and camcorders. As shown, the display stand 10 has a relatively short height and comprises an alarming base 20 and a sensor 30 for attachment to the item of merchandise M. A sensor cord 40 configured to extend between the base 20 and the sensor 30 is shown in FIG. 1B. The item of merchandise M is attached to the sensor 30, as will be described, and the sensor is removably supported on the base 20 with the sensor cord 40 extending upwardly from the base to the sensor. A first end 42 of the sensor cord 40 is electrically connected, for example via a telephone jack/plug style connection (e.g. RJ style), to monitoring and alarming electronics (not shown) disposed within the base 20. The sensor cord 40 is routed on the inside of the base 20 along the outer perimeter and then upwards through a central opening 22A (FIG. 6) formed in a pedestal portion 22 of the base. The second end 44 of the sensor cord 40 is then electrically connected, for example via a telephone jack/plug style connection (e.g. RJ style), to voltage regulator and sensor electronics (not shown) disposed within the sensor. It is important to note that the first end 42 and the second end 44 of the sensor cord 40 are removably connected to the electronics disposed within the base 20 and the sensor 30, respectively. In this manner, a worn, damaged or failed sensor cord 40 may be easily replaced, as will be described with respect to FIG. 5, without the need to replace the sensor 30, the base 20, or both. Furthermore, a swivel connection may be provided at either, or both, the first end 42 and the second end 44 of the sensor cord 40 to permit 360 degree rotation of the sensor 30 and/or the base 20 relative to the sensor cord. In this manner, the sensor cord 40 will not become excessively worn or damaged (e.g. kinked, tangled, etc.) during the expected commercial lifetime of the merchandise display stand 10.

FIG. 1A further illustrates a second exemplary embodiment of a display stand, indicated generally at 10', for displaying and protecting relatively large, relatively thick (or irregularly shaped) items of merchandise on display in a retail store, such as digital single-lens reflex (DSLR) cameras, single-lens reflex (SLR) cameras and larger camcorders. As shown, the display stand 10' has a relatively tall height and comprises an alarming base 20' and sensor 30 for attachment to the item of merchandise M'. It is intended that the sensor 30 is essentially the same for the display stand 10' as the display stand 10, with the possible exception of the voltage regulator and sensor electronics disposed within the sensor. A sensor cord 40' configured to extend between the base 20' and the sensor 30 is shown in FIG. 1B. The item of merchandise M' is attached to the sensor 30, as will be described, and the sensor is removably supported on the base 20' with the sensor cord 40' extending upwardly from the base to the sensor. A first end 42' of the sensor cord 40' is electrically connected, for example via a telephone jack/plug style connection (e.g. RJ style), to monitoring and alarming electronics (not shown) disposed within the base. The sensor cord 40' is routed on the inside of the base 20' along the outer perimeter and then upwards through a central opening 22A (FIG. 6) formed in a pedestal portion 22' of the base. The second end 44' of the sensor cord 40' is then electrically connected, for example via a telephone jack/plug style connection (e.g. RJ style), to voltage regulator and sensor electronics (not shown) disposed within the sensor. It is important to note that the first end 42' and the second end 44' of the sensor cord 40' are removably connected to the electronics disposed within the base 20' and the sensor 30, respectively. In this manner, a worn, damaged or failed sensor cord 40' may be easily replaced, as will be described with respect to FIG. 5, without the need to replace the sensor 30, the base 20', or both. Furthermore, a swivel connection may be provided at either, or both, of the first end 42' and the second end 44' of the sensor cord 40' to permit 360 degree rotation of the sensor 30 and/or the base 20 relative to the sensor cord. In this manner, the sensor cord 40' will not become excessively worn or damaged (e.g. kinked, tangled, etc.) during the expected commercial lifetime of the merchandise display stand 10'.

As best shown in FIG. 1B, the sensor 30 includes a bottom portion 32 and a top portion 34, also referred to herein as the "mount" 34. Bottom portion 32 defines an internal cavity or compartment that is sized, shaped and configured to house the voltage regulator and sensor electronics. Top portion 34 comprises an externally threaded fastener 35 that is movably disposed within an elongate, laterally extending channel 36 formed in the top portion. Threaded fastener 35 engages the internally threaded tripod mounting hole typically provided on cameras and camcorders. Fastener 35 is adjustable, and more particularly, slidable in a lateral direction on the top portion 34 of sensor 30 to accommodate items of merchandise M having various sizes, shapes and tripod mounting hole locations, while maintaining the item substantially centered on the sensor. In referred embodiments, the fastener 35 is provided on a movable carriage (not shown). Top portion 34 further comprises an outwardly biased "limit," "proximity" or "pressure" switch 37 for engaging an underside surface of the item of merchandise M as the item is attached to the sensor 30 via the fastener 35, as will be described. Switch 37 is electrically connected to the voltage regulator and sensor electronics disposed within the bottom portion 32 of the sensor 30. As shown herein, switch 37 is also slidably disposed for lateral movement on the top portion 34 of the sensor 30 along with the fastener 35 so that the distance between the switch and the fastener remains constant regardless of the size or shape of the item of merchandise attached to the sensor. The bottom portion 32 of the sensor 30 has a downwardly depending post 31 that is configured (sized and shaped) to be received in a cam sleeve 23 disposed within opening 22A (FIG. 6) formed in the upper end of the pedestal portion 22 or 22' of base 20 or 20', respectively. Sensor 30 may further comprise an optional anti-rotation bar 38, as will be described hereinafter with respect to FIG. 2 and FIG. 3B, for preventing the item of merchandise M from rotating relative to the top portion 34 of the sensor so that an unauthorized person cannot unscrew the item from the fastener 35 and thereby detach and remove the merchandise from the display stand 10. As previously mentioned, it is intended that the sensor 30 is useable with items of merchandise having varying sizes and shapes, and in particular, is useable with smaller cameras and camcorders on display stand 10, as well as larger cameras and camcorders on display stand 10'. Accordingly, sensor 30 is commercially known as a "universal" camera sensor.

The sensor cord 40, 40' comprises an elastic outer sheath 43, 43' made of an electrically insulating material that contains a plurality of conductors. As shown herein, the sensor cord 40, 40' is formed in a series of helical coils that allow the sensor cord to be extended (i.e. stretched) and returned to its original length when released. Extension of the helical coils of the sensor cord 40, 40' permits a potential purchaser to more closely examine the item of merchandise M, M' attached to the sensor 30 and, in instances wherein the plurality of conductors provides electrical power from an internal battery disposed within the base 20, 20' or an external power source, to operate the item of merchandise. In the embodiment shown herein, the conductors are connected at first end 42, 42' via a telephone style jack/plug connection (e.g. RJ) to the monitoring and alarming electronics disposed within the base 20, 20', and are connected at the second end 44, 44' via a telephone style jack/plug connection (e.g. RJ) to the voltage regulator and sensor electronics disposed within the sensor 30. In this manner, some of the conductors of the sensor cord 40, 40' provide electrical power to a voltage regulator circuit that adjusts the voltage from the display stand 10, 10' to an operating voltage suitable for the particular item of merchandise M, M' attached to the sensor 30. Alternatively, different power connectors 50 (FIGS. 2-4) comprising suitable resistors or other voltage modulating components may be provided for each item of merchandise M, M' having a different operating voltage. Other conductors of the sensor cord 40, 40' define an electrical sense loop between the switch 37 of the sensor 30 and the monitoring and alarming electronics disposed within the base 20, 20'. In the event that the sense loop is interrupted; including, for example, by cutting or severing outer sheath 43, 43' of the sensor cord 40, 40', disconnecting the connection at either the first end 42, 42' or the second end 44, 44' of the sensor cord, or detaching the item of merchandise M, M' from the sensor 30; an alarm is activated to alert store personnel to a possible attempted theft.

Figure 2:
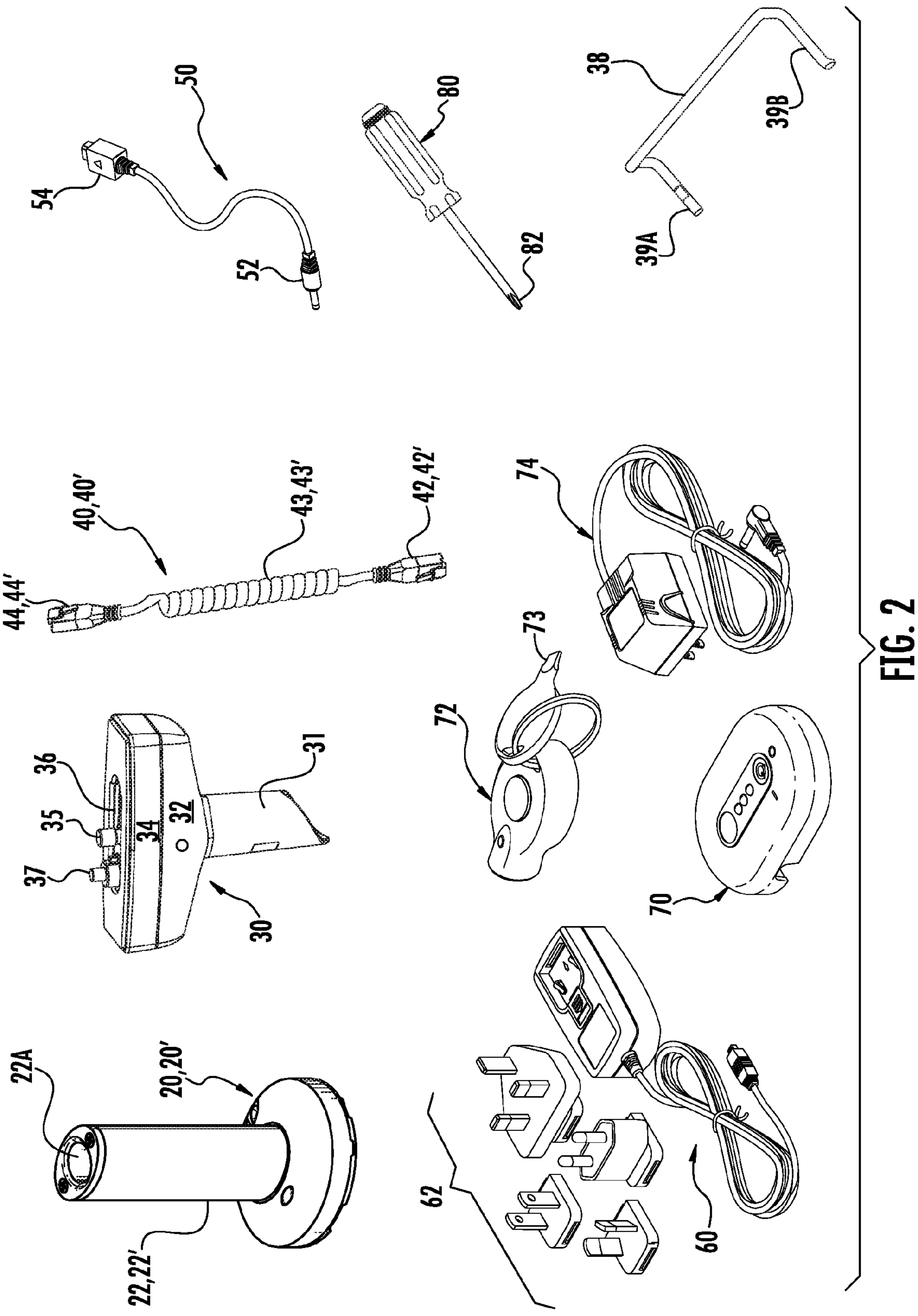
FIG. 2 shows a series of perspective views illustrating the various components of the merchandise display security devices of FIG. 1A.

FIG. 2 illustrates the various components utilized with a merchandise display security system, such as display stand 10, 10', according to the invention. Each display stand 10, 10' includes a base 20 or 20', a sensor 30, a sensor cord 40 or 40', and a power connector 50. The only essential difference between the base 20 and the base 20' is the height of the pedestal portion 22, 22', respectively. Accordingly, the only essential difference between the sensor cord 40 and the sensor cord 40' is the length of the outer sheath 43, 43, respectively. The display stand 10 or 10' may further comprise a power supply (e.g. 18 volt) cord 60 and one or more optional adapters 62 for electrically connecting the display stand to an external source of power. The display stand 10 or 10' may also further comprise an optional programming station 70 and programmable communication key 72 along with a programming station power supply cord 74 for providing electrical power to the programming station from an external source of power. The display stand 10 or 10' may optionally comprise the anti-rotation bracket 38 for use with the sensor 30, as previously described. If used, the programming station 70 generates a unique security code, referred to herein as the security disarm code (SDC), and transfers (i.e. programs) the SDC into the communication key 72. In the exemplary embodiments shown and described herein, the communications key 72 is a wireless infrared (IR) key. However, the communication key 72 may also utilize radio frequency (RF) or inductive transfer technology to wirelessly receive the SDC from the programming station 70 and to transfer the SDC to a security device, such as the display stand 10 or 10' in a known manner. Alternatively, the communication key 72 may communicate (i.e. receive and transmit) the SDC using electrically conductive contacts in a conventional manner. A special tool 80 comprising a proprietary shaped tip 82 is required to attach the merchandise M, M' to the sensor 30 using tamper-proof fastener 35 having a theft-resistant head, and to secure the top portion 34 to the bottom portion 32 of the sensor using a similar tamper-proof fastener having a theft-resistant head.

Figure 3A:
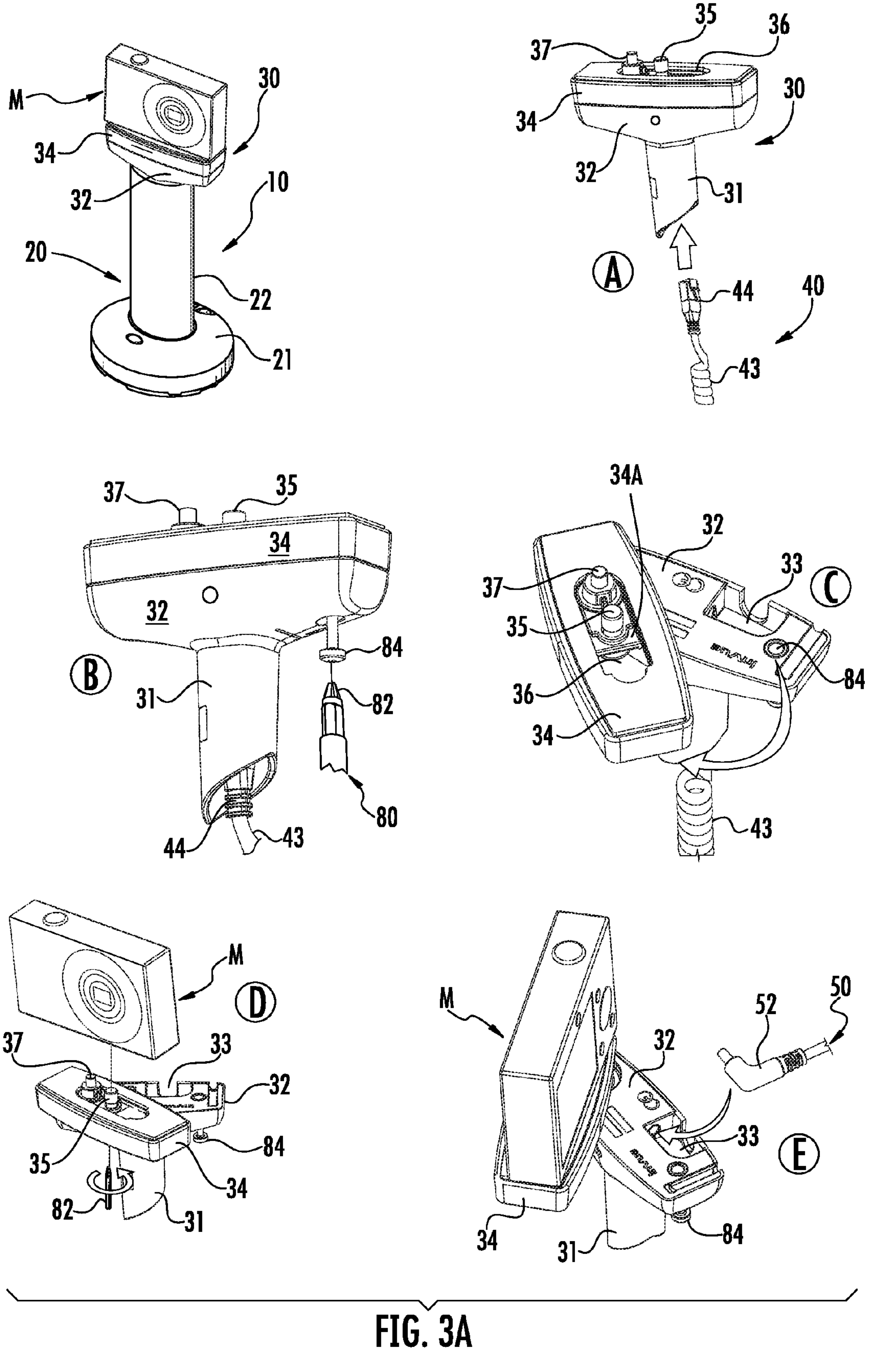
FIG. 3A and FIG. 3B show a series of perspective views illustrating a method according to the invention of attaching smaller items of merchandise on the merchandise display security devices of FIG. 1A including the sensor of FIG. 1B and a power connector.
Figure 3B:
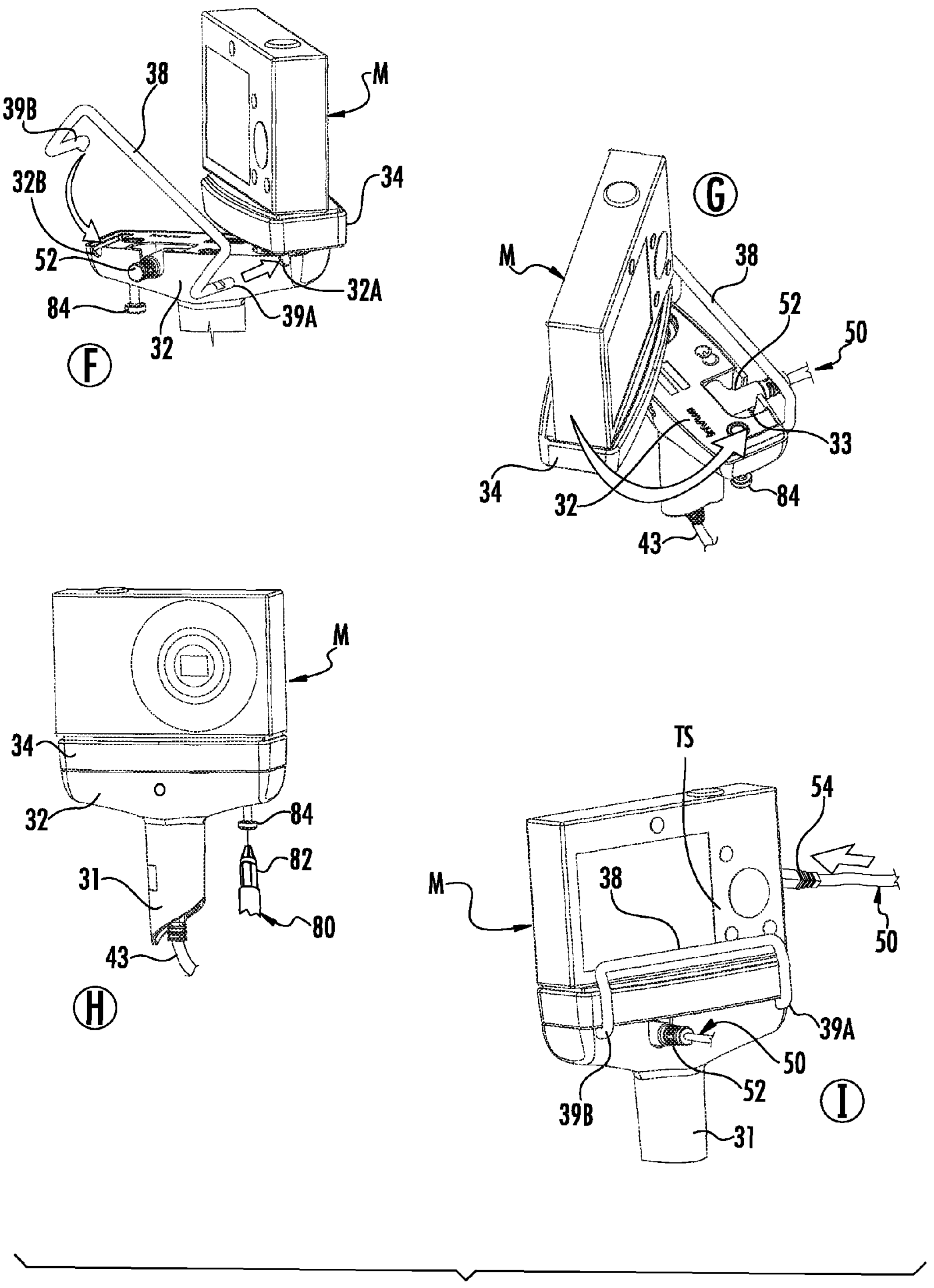

FIG. 3A and FIG. 3B illustrate a method according to the invention of attaching an item of merchandise M, namely a relatively small handheld camera, to the display stand 10. As indicated at A in the series of perspective views, the second end 44 of the sensor cord 40 is electrically connected to the bottom portion 32 of the sensor 30 via the releasable telephone style jack/plug connection (i.e. RJ). As indicated at B, the tool 80 is then used to loosen a tamper-proof fastener 84 having a proprietary head that normally secures the bottom portion 32 to the top portion, or mount 34 of the sensor 30. As indicated at C, the mount 34 of the sensor 30 is then moved, and in particular, rotated relative to the bottom portion 32 to expose a recess 33 configured (sized and shaped) to receive a first end 52 of a power connector 50 having a proprietary connector to electrically connect the power connector to the voltage regulator and sensor electronics disposed within the bottom portion of the sensor. As indicated at D, the position of the fastener 35 and switch 37 of the sensor 30 is then adjusted laterally, for example by sliding a carriage 34A on a rail structure, to align the fastener with the tripod hole provided on the underside surface of the merchandise M. The fastener 35 is then tightened onto the merchandise M sufficiently so that the switch 37 is fully depressed, and thus, in an "armed" state with the merchandise attached to the mount 34 of the sensor 30. As indicated at E, the first end 52 of the power connector 50 is next inserted into the recess 33 within the bottom portion 32 of the sensor 30 so that the power connector is electrically connected to the voltage regulator and sensor electronics.

If desired to prevent an unauthorized person from unscrewing the merchandise M from the fastener 35, the optional anti-rotation bracket 38 having the appropriate size, and in particular width W (FIG. 2), for the thickness of the merchandise M is then installed into the bottom portion 32 of the sensor 30. As indicated at F, bracket 38 is rotated clockwise so that a first end 39A of the bracket can be inserted into a corresponding L-shaped first slot 32A formed in the bottom portion 32 of the sensor 30. The bracket 38 is next rotated counter-clockwise so that a second end 39B of the bracket can be inserted into a corresponding second slot 32B formed in the bottom portion 32 of the sensor 30. With the anti-rotation bracket 38 in place, the mount 34 of the sensor 30 with the attached merchandise M is then rotated back into its original position as indicated at G so that the mount covers the recess 33 containing the first end 52 of the power connector 50 and covers the L-shaped first slot 32A containing the end 39A of bracket, while a transverse surface TS of the merchandise M abuts the anti-rotation bracket. As indicated at H, mount 34 with the attached merchandise M is then secured to the bottom portion 32 of the sensor 30 using the tamper-proof fastener 84 to prevent the first end 52 of the power connector 50 from being removed or unplugged from the sensor 30 and to prevent the anti-rotation bracket 38 from being removed from the sensor when the merchandise M is positioned in a desired orientation for display on the display stand 10. As indicated at I, a second end 54 of the power connector having a specific connector (e.g. mini USB) compatible for use with the merchandise M is then electrically connected to a power input port provided on the merchandise. Although not shown, the first end 42 of the sensor cord 40 is next routed downwardly through the pedestal portion 22 of the base 20 and electrically connected to the base of the display stand 10 via the telephone style jack/plug connection (e.g. RJ) previously mentioned to electrically connect the sensor cord to the monitoring and alarming electronics disposed within the base. The sensor 30 with the merchandise M is then positioned on the pedestal portion 22 of the base 20 in the desired orientation to be available for operation and evaluation by a potential purchaser.

Figure 4A:
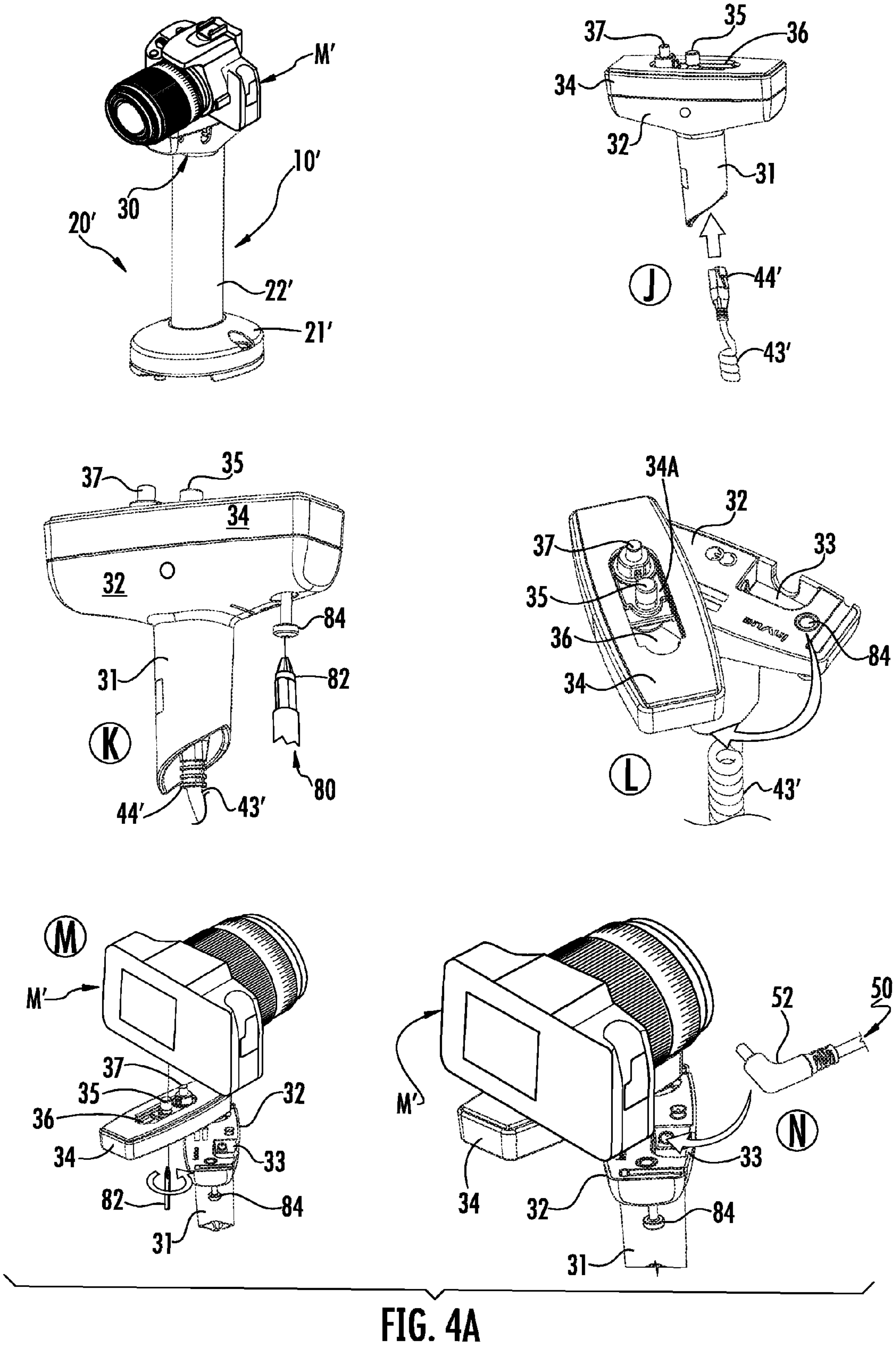
FIG. 4A and FIG. 4B show a series of perspective views illustrating a method according to the invention of attaching larger items of merchandise on the merchandise display security devices of FIG. 1A including the sensor of FIG. 1B and a power connector.
Figure 4B:
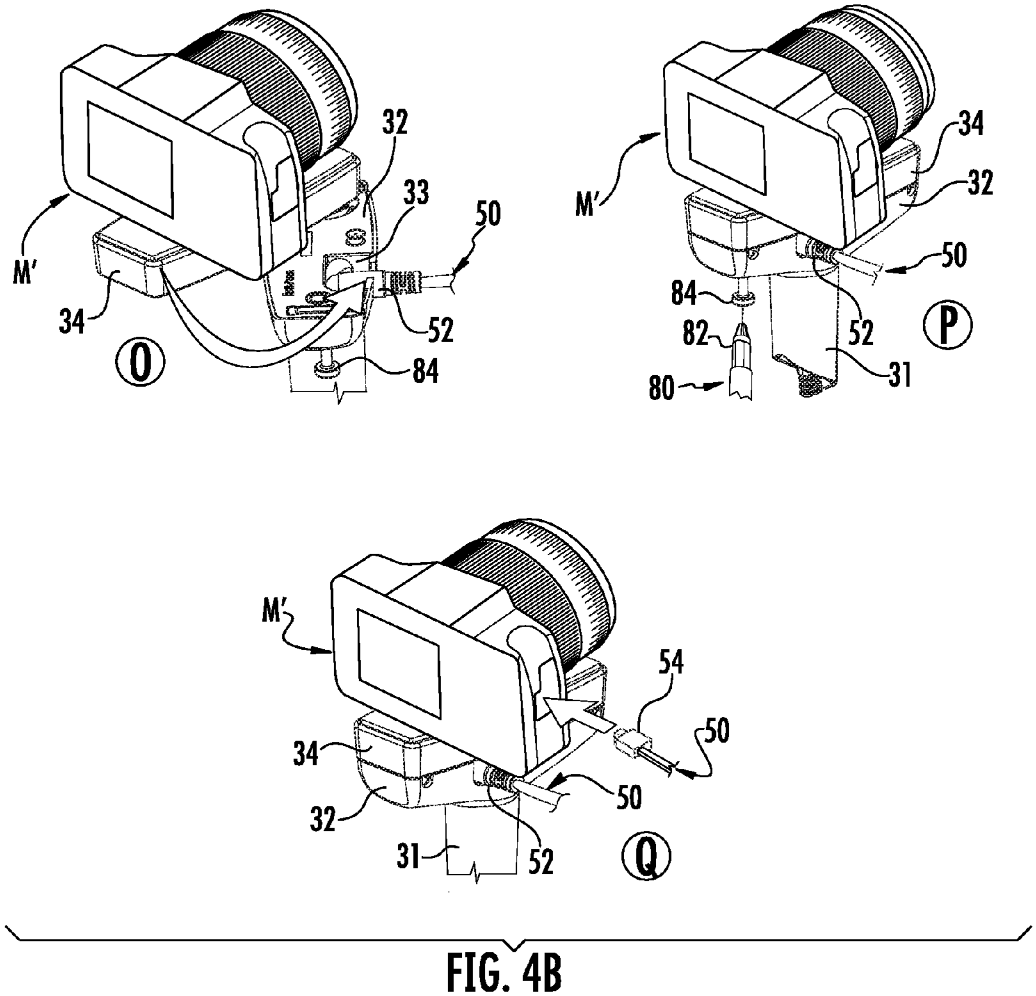

FIG. 4A and FIG. 4B illustrate a method according to the invention of attaching merchandise M', namely a relatively large SLR camera, to display stand 10'. As indicated at J-Q in the series of perspective views, the merchandise M' is attached to the mount 34 of the sensor 30 in essentially the same manner as previously described with respect to smaller merchandise M in FIG. 3A and FIG. 3B. The primary differences between the method illustrated in FIGS. 4A-4B and the method illustrated in FIGS. 3A-3B is that the merchandise M' is larger than the merchandise M, and the merchandise display stand 10' utilizes a base 20' having a taller pedestal portion 22' and a longer sensor cord 40'. In addition, the larger merchandise M' does not accommodate the optional anti-rotation bracket 38 of the sensor 30 illustrated at F-I in FIG. 3B. Otherwise, the installation of the merchandise M' onto the mount 34 of the sensor 30 is essentially the same, except that the merchandise M' is positioned in a different orientation for display on the display stand 10' than the desired orientation for display of the merchandise M on the display stand 10.

Figure 5:
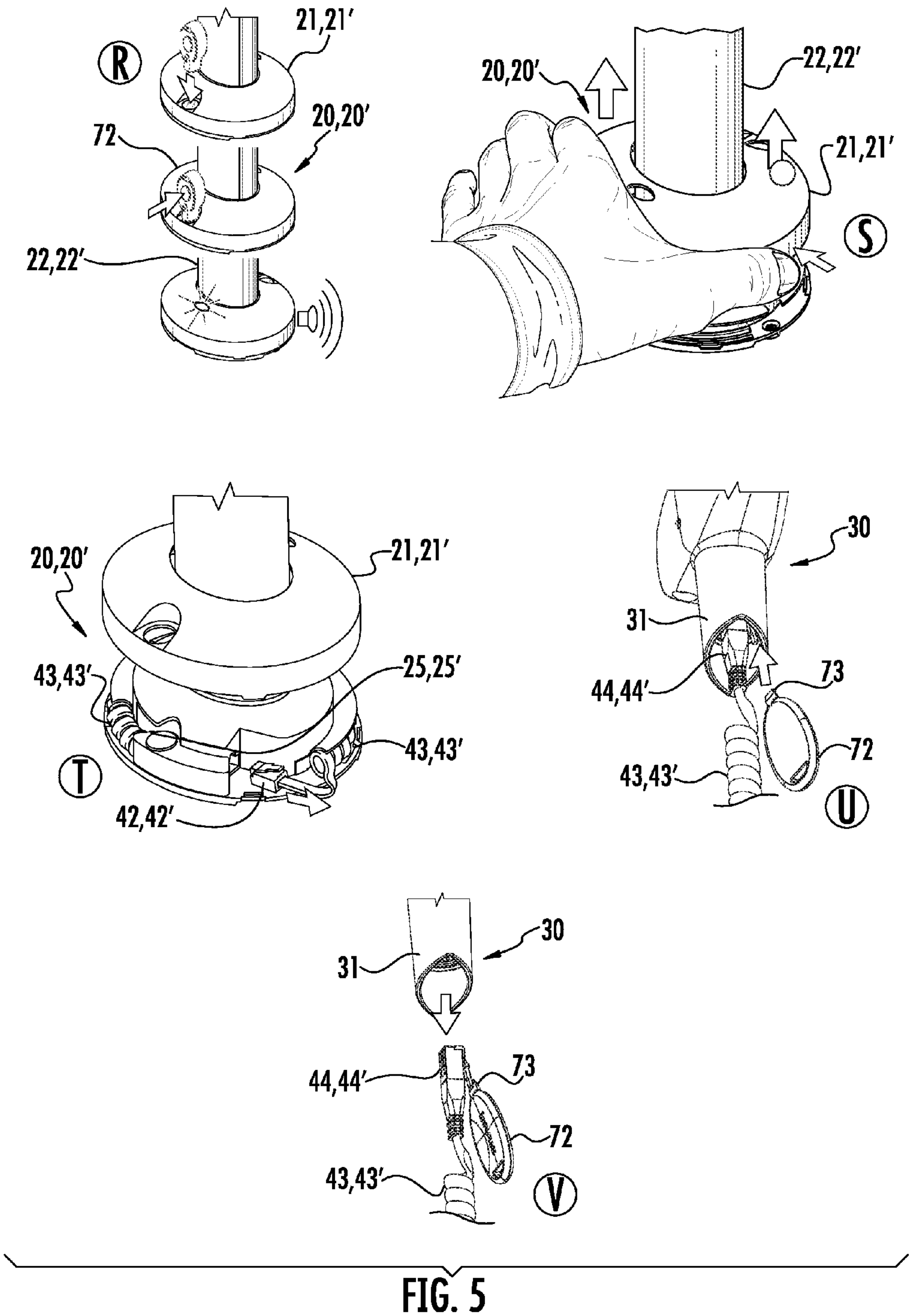
FIG. 5 shows a series of perspective views illustrating a method according to the invention of replacing the sensor cord of the merchandise display security devices of FIG. 1A including the sensor of FIG. 1B.

FIG. 5 illustrates a method according to the invention of replacing the sensor cord 40, 40' of the display stand 10, 10', respectively in the event that the sensor cord becomes worn or damaged, or fails. As indicated at R in the series of perspective views, the monitoring and alarming electronics disposed within the base 20, 20' is first disarmed in a known manner using the communication key 72 programmed with the SDC by the programming station 70. As indicated at S, the lateral sides of a movable cover 21, 21' positioned over the base 20, 20' are pinched to release the cover from the base and permit the cover to be lifted upwards off the base to expose the telephone style jack/plug connection 25, 25' within the base. As indicated at T, the first end 42, 42' of the sensor cord 40, 40' is next disconnected at the connection 25, 25' and the sensor cord is unwound from the outer perimeter of the base 20, 20' and removed through the hollow pedestal portion 22, 22' of the base. As indicated at U and V, a tab 73 provided on a FOB portion of the communication key 72 is then aligned with a notch provided in the post 31 of the sensor 30 and pressed to remove the second end 44, 44' of the sensor cord 40, 40' from the sensor. A replacement sensor cord 40, 40' may be installed in an essentially reverse manner as that described herein with respect to FIG. 5.

Figure 6:
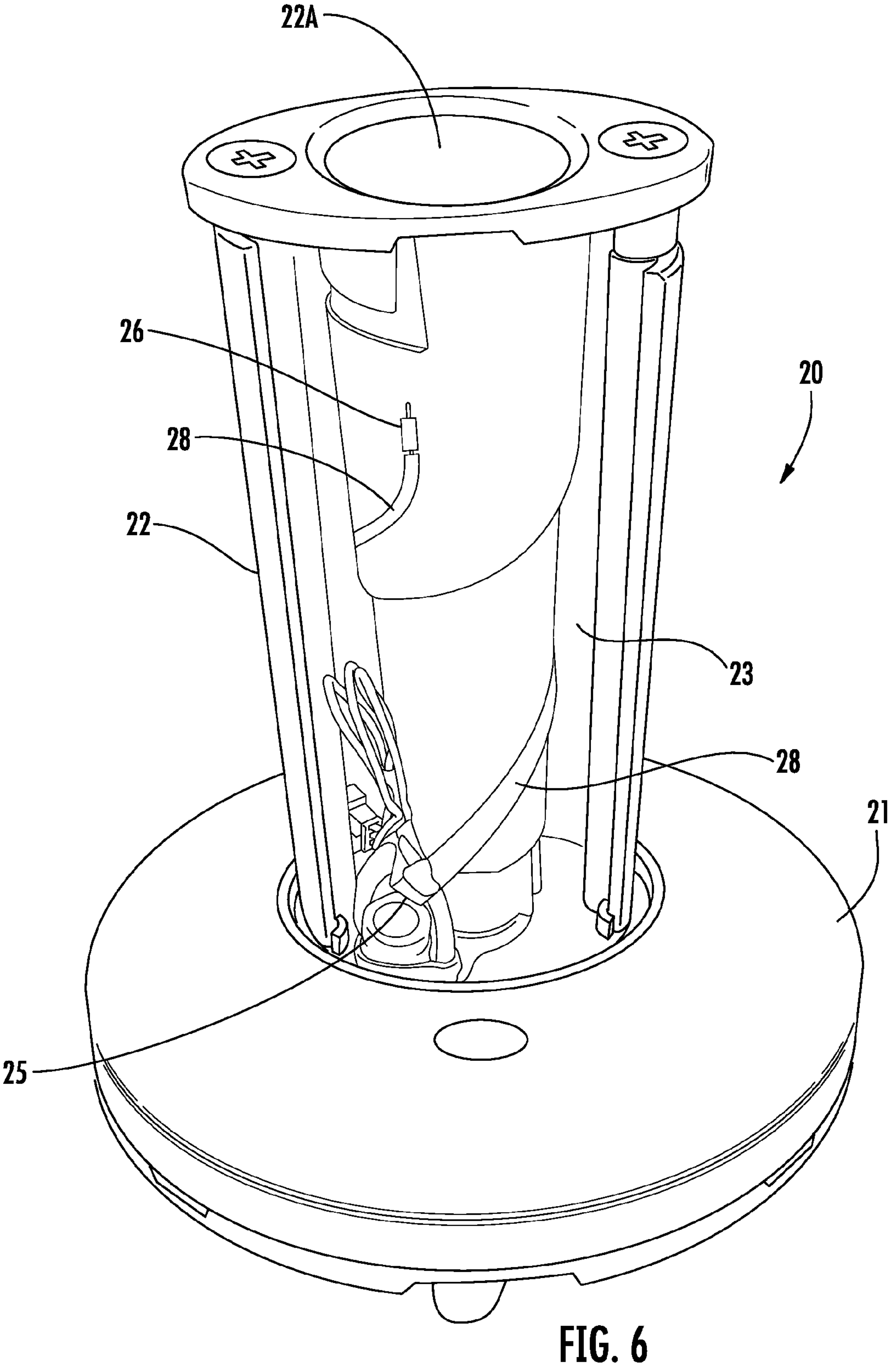
FIGS. 6-9 show perspective views illustrating an exemplary embodiment of a merchandise display stand having a rotatable cam sleeve according to the invention.
Figure 7:
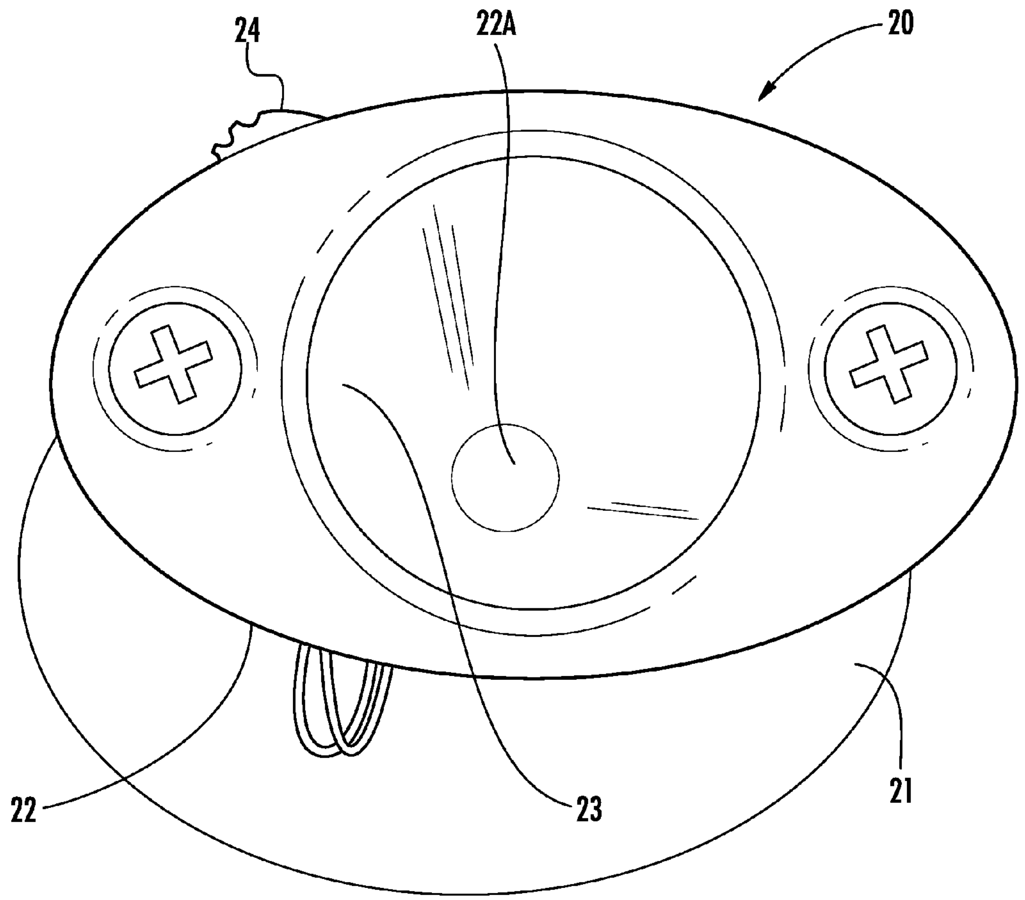
Figure 8:
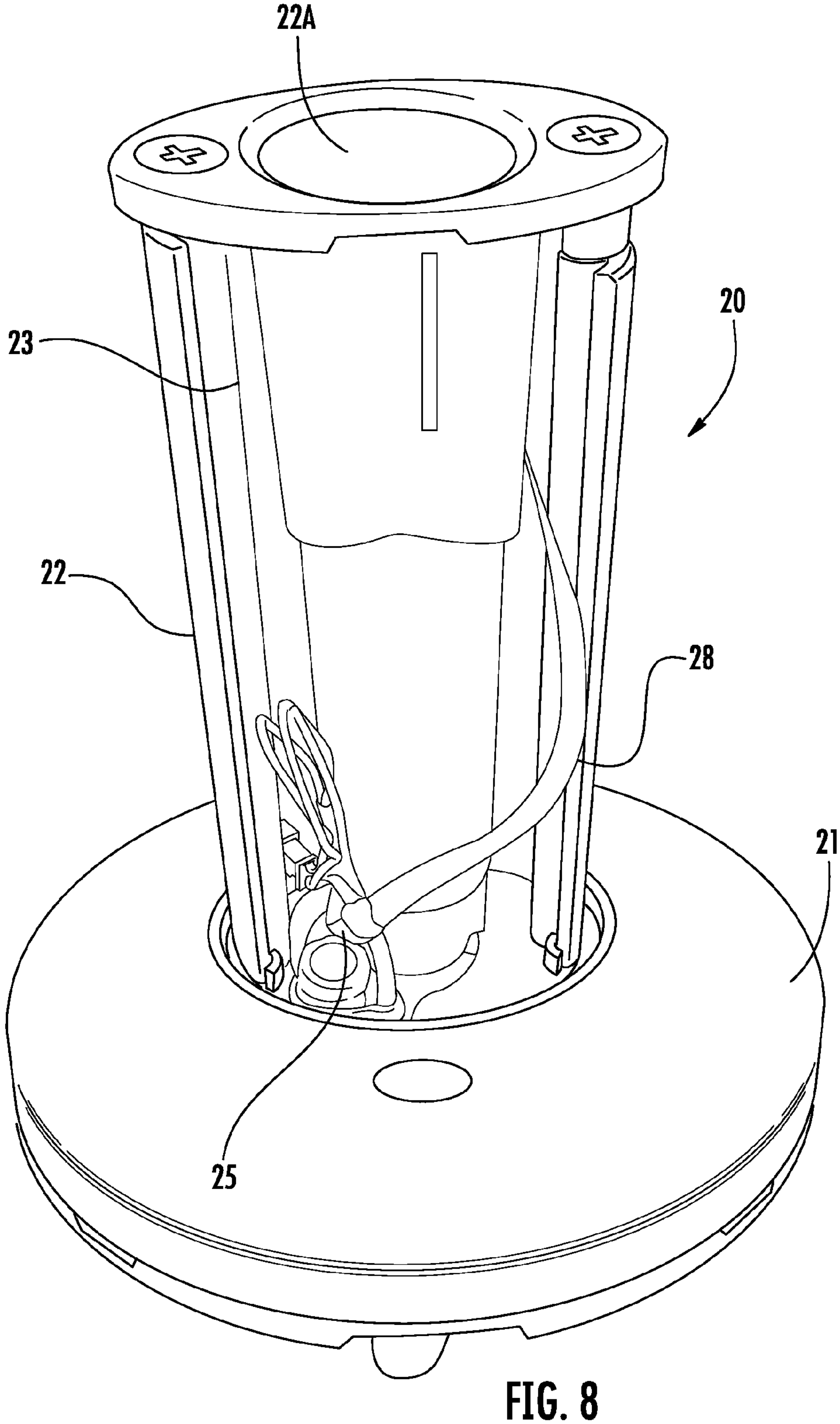
Figure 9:
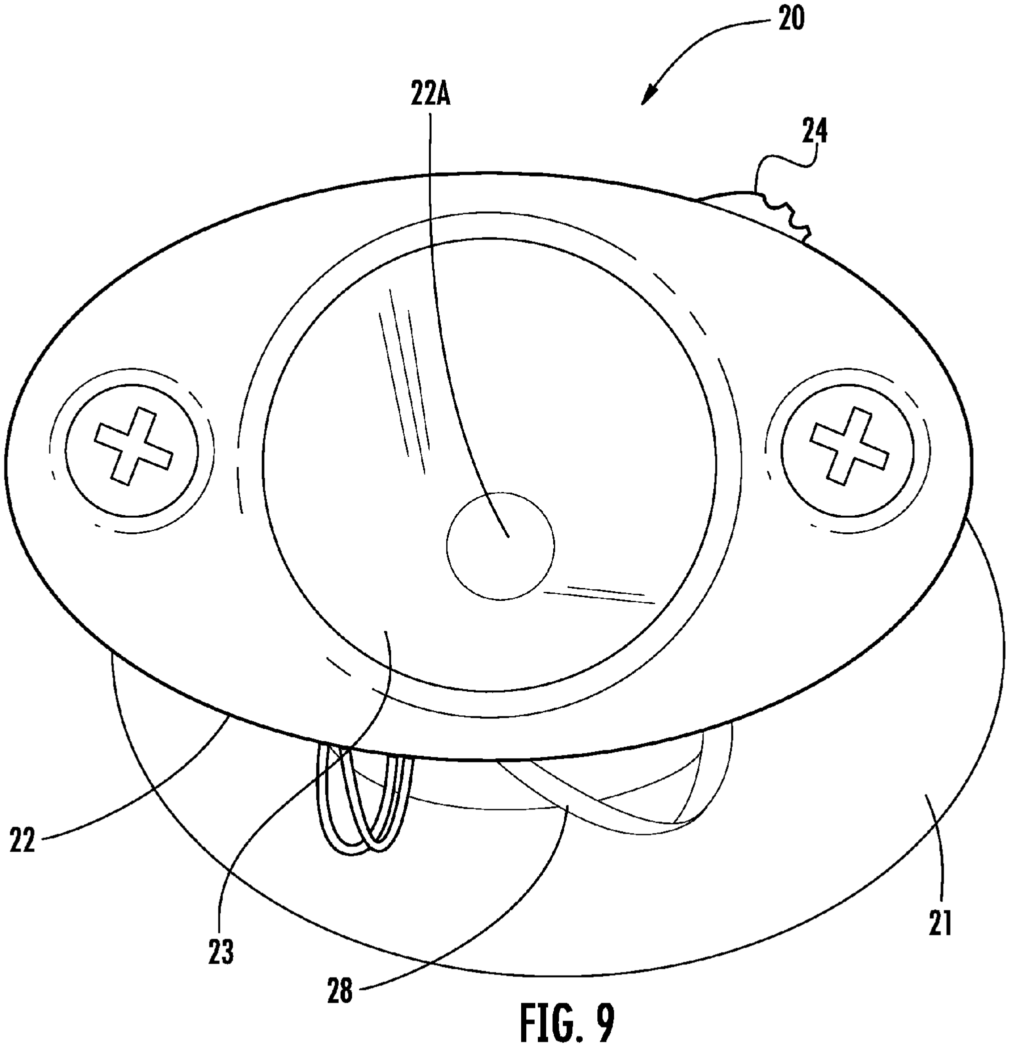

FIGS. 6-9 illustrate an exemplary embodiment of a merchandise display security device, and in particular merchandise display stand 10, including a rotatable cam sleeve 23 according to the invention. The cam sleeve 23 is disposed within an opening 22A formed in the upper end of the pedestal portion 22 of the base 20 and is sized and shaped to receive the post 31 (not shown) of the sensor 30 (not shown) therein. FIG. 6 and FIG. 7 are elevation and top views, respectively, showing the cam sleeve 23 of the base 20 in a first position. FIG. 8 and FIG. 9 are elevation and top views, respectively, showing the sleeve 23 of the base 20 in a second position that is rotated approximately 90 degrees (90°) from the first position shown in FIG. 6 and FIG. 7. The cam sleeve 23 is rotatable relative to the remainder of the base 20 so that the sensor 30, and consequently, the item of merchandise M (not shown) on display can be positioned on the display stand 10 in a desired orientation for display without removing the display stand from the support surface (e.g. counter, tabletop, shelf, etc.) of the display area, or without removing and repositioning the merchandise M on the sensor 30. Cam sleeve 23 is rotatably mounted relative the pedestal portion 22 and is movable between the first position and the second position by a lever 24 (FIG. 7 and FIG. 9) disposed within a slot formed in the pedestal portion and accessible from the exterior. It should be noted that the base 20 further comprises a conventional Hall Effect transducer 26 (FIG. 6) for indicating when the sensor 30 has been removed (i.e. picked up) from the cam sleeve 23 of the base 20. The indication from transducer 26 that the sensor 30 has been picked up from the base 20 can be used to trigger an audio and/or video presentation that provides information to a potential purchaser about the item of merchandise M on display. The conventional printed circuit board (PCB) and wiring of the Hall Effect transducer 26 is replaced by a flexible circuit 28 so as to be rotatable between the first position and the second position without damaging the transducer.

The foregoing has shown and described one or more exemplary embodiments of a universal camera sensor having a movable mount and a base therefore having a rotatable cam sleeve. One or more exemplary embodiments of a method of attaching relatively small cameras and camcorders or relatively large cameras and camcorders to the sensor have also been shown and described along with an exemplary method of replacing, if necessary, a worn, damaged or defective sensor cord. It should be noted that the components of the sensor and base and the steps indicated for the methods are exemplary only, and that other essentially equivalent components and steps may be substituted for those shown and described herein without departing from the intended content and scope of the invention. In particular, many modifications and other embodiments of the invention will be readily apparent to one skilled in the art having the benefit of the teachings presented in the foregoing description and accompanying drawings. Therefore, it is to be understood that the invention is not limited to the exemplary embodiments shown and described herein and that modifications to the disclosed embodiments and other undisclosed embodiments are intended to be included within the content and scope of the appended claims.

That which is claimed is:

1. A merchandise display security device for displaying an item of merchandise, comprising:

a sensor comprising a bottom portion having a recess formed therein and a top portion movably disposed on the bottom portion, the top portion configured for attaching the item of merchandise to the sensor for display on the merchandise display security device;

a base adapted to removably support the sensor in a display orientation; and a sensor cord having an end connected to the sensor, wherein the recess formed in the bottom portion of the sensor is configured to receive a power connector therein such that the power connector cannot be removed from the sensor when the top portion of the sensor is aligned with and secured to the bottom portion, and wherein the top portion is rotatably disposed on the bottom portion such that rotation of the top portion in one direction exposes the recess while rotation in an opposite direction covers the recess.

2. A merchandise display security device according to claim 1, wherein the sensor cord has a first end releasably connected to the base and a second end releasably connected to the sensor.

3. A merchandise display security device according to claim 2, wherein the sensor cord comprises an outer sheath made of an electrically insulating material containing a plurality of conductors, and wherein the first end of the sensor cord is electrically connected to electronics disposed within the base and the second end of the sensor cord is electrically connected to electronics disposed within the sensor.

4. A merchandise display security device according to claim 1, further comprising an anti-rotation bracket adapted to be positioned on the bottom portion of the sensor and to be retained thereon when the top portion of the sensor is aligned with and secured to the bottom portion, the anti-rotation bracket preventing the item of merchandise from being rotated relative to the sensor from a desired display orientation.

5. A merchandise display security device according to claim 1, further comprising a fastener for attaching the item of merchandise to the sensor wherein the fastener is mounted on a carriage configured for lateral movement on the sensor.

6. A merchandise display security device according to claim 1, further comprising a power connector having a first end configured to be received within the recess formed in the bottom portion of the sensor and electrically connected to electronics disposed within the bottom portion, and a second end configured to be electrically connected to the item of merchandise.

7. A merchandise display security device according to claim 1, further comprising a base including a generally hollow pedestal portion and a cam sleeve rotatably disposed within the pedestal portion of the base, the cam sleeve being movable between a first position for displaying the item of merchandise in a first display orientation and a second position for displaying the item of merchandise in a second display orientation different than the first display orientation.

8. A merchandise display security device according to claim 1, further comprising a base including a generally hollow pedestal portion having a central opening formed therein, and wherein the sensor comprises a post depending from the bottom portion of the sensor and configured to be received within the opening.

9. A merchandise display security device for displaying an item of merchandise comprising:

a base including a generally hollow pedestal portion and a cam sleeve having a central opening, the cam sleeve rotatably disposed within the pedestal portion for rotational movement relative to the pedestal portion; and a sensor configured for attaching the item of merchandise to the sensor to be displayed on the merchandise display security device, the sensor comprising a post configured to be received within the opening of the cam sleeve such that the item of merchandise is positioned in a different display orientation upon rotation of the cam sleeve relative to the pedestal portion, wherein the sensor comprises a bottom portion having a recess formed therein and a top portion moveably disposed on the bottom portion, and wherein the recess formed in the bottom portion of the sensor is configured to receive a power connector therein such that the power connector cannot be removed from the sensor when the top portion of the sensor is aligned with and secured to the bottom portion.

10. A merchandise display security device according to claim 9, further comprising a flexible circuit including a transducer disposed on the cam sleeve within the pedestal portion of the base for indicating when the post of the sensor has been removed from the opening of the cam sleeve.

11. A method of attaching an item of merchandise to a merchandise display security device, comprising:

providing a sensor comprising a bottom portion having a recess formed therein and a top portion movably disposed on the bottom portion, the top portion configured for attaching the item of merchandise to the sensor for display on the merchandise display security device;

connecting an end of a sensor cord to the sensor;

moving the top portion of the sensor relative to the bottom portion of the sensor to expose the recess;

providing a power connector configured to be received within the recess formed in the bottom portion of the sensor and positioning the power connector within the recess;

moving the top portion of the sensor over the recess and aligned with the bottom portion of the sensor;

securing the top portion of the sensor and the bottom portion of the sensor together such that the power connector cannot be removed from the sensor; and positioning the sensor on the base for removably supporting the sensor in a display orientation.

12. A method according to claim 11, after moving the top portion of the sensor relative to the bottom portion of the sensor to expose the recess, further comprising positioning an anti-rotation bracket on the bottom portion of the sensor such that the anti-rotation bracket cannot be removed from the sensor after the top portion is moved over the recess and secured to the bottom portion.

13. A method according to claim 11, further comprising:

providing the base including a pedestal portion defining a central opening for receiving the sensor on the base;

providing the sensor cord having a first releasable connector at a first end and a second releasable connector at a second end;

wherein the connecting step comprises:

connecting the first releasable connector at the first end of the sensor cord to electronics disposed within the base;

routing the sensor cord through the base and out the central opening defined by the pedestal portion; and connecting the second connector at the second end of the sensor cord to electronics disposed within the sensor.

14. A method according to claim 11, further comprising:

providing a base including a generally hollow pedestal portion and a cam sleeve having a central opening for receiving the sensor, the cam sleeve being rotatably disposed within the pedestal portion for rotational movement relative to the pedestal portion; and rotating the cam sleeve relative to the pedestal portion of the base such that the item of merchandise positioned on the base is moved between a first display orientation and a second display orientation.

15. A merchandise display security device according to claim 1, wherein the top portion is configured to be secured to the bottom portion when in alignment with one another such that the top portion is unable to be moved relative to the bottom portion.

16. A merchandise display security device according to claim 9, wherein the base further comprises a lever configured to rotate the cam sleeve between different display orientations.

17. A method according to claim 11, wherein securing comprises fastening the bottom portion to the top portion.

18. A method according to claim 11, wherein moving the top portion of the sensor relative to the bottom portion comprises rotating the top portion relative to the bottom portion.

* * * * *